(12) United States Patent
Okuyama

(10) Patent No.: US 7,336,391 B2
(45) Date of Patent: Feb. 26, 2008

(54) MULTI-EXPOSURE DRAWING METHOD AND APPARATUS THEREFOR

(75) Inventor: Takashi Okuyama, Saitama (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 943 days.

(21) Appl. No.: 10/180,121

(22) Filed: Jun. 27, 2002

(65) Prior Publication Data

US 2003/0001798 A1    Jan. 2, 2003

(30) Foreign Application Priority Data

Jun. 29, 2001    (JP)    ............................ P2001-198375

(51) Int. Cl.
   *G06F 15/00*    (2006.01)
   *G06K 1/00*    (2006.01)
   *G06K 15/10*    (2006.01)

(52) U.S. Cl. ........................ 358/1.8; 347/237; 347/239; 347/247; 347/255; 355/48; 355/50; 358/1.2; 358/1.14

(58) Field of Classification Search ............... 358/1.18, 358/1.15, 1.2, 1.8, 1.14; 347/237, 239, 247, 347/255; 355/48, 50
   See application file for complete search history.

(56) References Cited

U.S. PATENT DOCUMENTS

| 4,901,066 | A | * | 2/1990 | Kobayashi et al. ........... 345/94 |
| 5,049,901 | A | | 9/1991 | Gelbart |
| 6,027,202 | A | * | 2/2000 | Narushima .................... 347/40 |
| 6,235,438 | B1 | * | 5/2001 | Suzuki et al. ................. 430/30 |
| 6,251,550 | B1 | | 6/2001 | Ishikawa |
| 6,537,738 | B1 | | 3/2003 | Mei et al. |

FOREIGN PATENT DOCUMENTS

| JP | 9-17718 | 1/1997 |
| JP | 10-147007 | 6/1998 |

* cited by examiner

*Primary Examiner*—Twyler Lamb
*Assistant Examiner*—Yixing Qin
(74) *Attorney, Agent, or Firm*—Greenblum & Bernstein, P.L.C.

(57) ABSTRACT

In a multi-exposure drawing method for drawing a pattern on a drawing surface, using an exposure unit including a plurality of optical modulation elements arranged in a matrix manner, the unit is continuously and relatively moved at a constant velocity with respect to the drawing surface in an array-direction defined by a matrix-arrangement of the modulation elements. Optical modulation elements, spaced at a regular interval in an alignment of optical modulation elements along the array-direction, are successively and selectively driven based on a same bit datum, to thereby modulate a light beam made incident thereon, whenever the exposure unit is moved by a distance corresponding to the regular interval, resulting in the production of a pixel dot on the drawing surface in a multi-exposure manner by the modulated light beams. The exposure time for producing the pixel dot by each of the modulated light beams is shorter than the time required to move the exposure unit by a distance corresponding to the size of one pixel dot.

14 Claims, 12 Drawing Sheets

MULTI-EXPOSURE DRAWING METHOD AND APPARATUS THEREFOR

BACKGROUND OF THE INVENTION

1. Field of the Invention

The present invention relates to a drawing method for drawing a pattern on a surface of a workpiece, using an exposure unit including a plurality of optical modulation elements arranged in a matrix manner, and also relates to a drawing apparatus in which the drawing method is executed.

2. Description of the Related Art

In general, such a drawing apparatus is used for optically drawing fine patterns, characters, symbols and so on the surface of a suitable workpiece. A representative use of the drawing apparatus is for a circuit pattern drawn on a workpiece when a printed circuit board is manufactured by using photolithography. In this case, the workpiece may be either a photosensitive film for producing a photomask or a photoresist layer formed on a suitable substrate.

Recently, circuit pattern drawing systems have been developed for efficiently carrying out the drawing of circuit patterns by integrating the use of a drawing apparatus, a CAD (Computer Aided Design) station for designing a circuit pattern, and a CAM (Computer Aided Manufacturing) station for editing the designed circuit. The drawing apparatus, the CAD station, and the CAM station are all connected to each other through a LAN (local area network).

A circuit pattern is designed and treated as vector-graphic data by the CAD station. The vector-graphic data may be fed from the CAD station to the CAM station, through the LAN, for editing the designed circuit pattern, if necessary. The vector-graphic data is fed from either the CAD station or the CAM station to the drawing apparatus, and is stored in a storage medium, such as a hard disk, provided in the drawing apparatus.

The drawing apparatus is provided with a vector-to-raster converter, and a bit-map memory. The vector graphic data is read from the hard disk, for example, and is converted into raster-graphic data by the vector-to-raster converter. Then, the raster-graphic data are developed and stored in the bit-map memory for a drawing operation.

The drawing apparatus is further provided with an exposure unit for drawing a circuit pattern on the workpiece based on the raster-graphic data, and the exposure unit may comprise a digital micro-mirror device (DMD) unit, a liquid crystal display (LCD) array unit or the like.

As is well known, the DMD unit has a reflecting surface which is formed from a plurality of micro-mirror elements arranged in a matrix manner. Each micro-mirror element is independently driven between a first reflecting position and a second reflecting position. Thus, it is possible to divide a light beam, which is wholly made incident on the reflecting surface of the DMD unit, into a plurality of light beams by independently driving each of the micro-mirror elements between the first and second reflecting positions.

In the DMD unit assembled in the drawing apparatus, when each micro-mirror element is at the first reflecting position, it reflects the light beam such that the reflected light beam is directed toward the workpiece, and when each micro-mirror element is at the second reflecting position, it reflects the light beam such that the reflected light beam deviates from the workpiece. Thus, since each of the micro-mirror elements serves as an optical modulation element, it is possible to draw the circuit pattern on the workpiece by operating the DMD unit in accordance with the raster-graphic data read from the bit-map memory.

Also, as is well known, the LCD array unit comprises a pair of transparent plate members with a liquid crystal intervened therebetween, and plural pairs of transparent electrode elements arranged on and attached to the transparent plate members in a matrix manner so that the transparent electrode elements in each pair are registered with each other. With the arrangement of the LCD array unit, it is possible to selectively allow penetration of a light beam through each pair of transparent electrode elements by controlling application of a voltage to the electrode elements in pairs. Thus, since each pair of the transparent electrode elements also serves as an optical modulation element, the circuit pattern can be drawn on the workpiece by operating the LCD array unit in accordance with the raster-graphic data read from the bit-map memory.

Furthermore, the drawing apparatus is provided with a light source device for generating and introducing a light beam into the exposure unit. A suitable lamp, such as a light emitting diode (LED), a high-pressure mercury-vapor lamp, a xenon lamp, a flash lamp and so on, is used in the light source device, according to the sensitivity and the optical characteristics of the photoresist layer on the workpiece.

Usually, a circuit pattern to be drawn on the workpiece has an area which is considerably larger than an exposure area obtained from an exposure unit or from several exposure units. Thus, it is necessary to scan the workpiece with at least one exposure unit before a large circuit pattern can be completely drawn on the workpiece. To this end, the drawing apparatus is provided with a movable drawing table on which the workpiece is placed. The drawing table is moved relative to the exposure unit, whereby the workpiece on the drawing table is scanned with the exposure unit.

Conventionally, a "step & repeat" method is used as a scanning method in the drawing apparatus. In particular, in the "step & repeat" method, the drawing table is intermittently moved relative to the exposure unit, so that a part of the circuit pattern is drawn on the workpiece by operating the exposure unit based on raster-graphic data during the stoppage of the drawing table, and the intermittent movement of the drawing table is continued until the circuit pattern is completely drawn.

There are various drawbacks in the "step & repeat" method. First, the drawing speed is slow because of the intermittent movement of the drawing table. Namely, the drawing is not performed during the movement of the drawing table, and therefore the entire drawing time must be calculated as the sum of the movement time of the drawing table and the stoppage time of the drawing table. It is possible to increase the drawing speed, using a high-power light source device, but the high-power light source device is costly.

Also, the drive mechanism for driving the drawing table is susceptible to damage because acceleration and deceleration of the drawing table must be frequently and repeatedly carried out due to the intermittent movement of the drawing table.

Furthermore, in the "step & repeat" method, when any one of the optical modulation elements malfunctions, the optical modulation element concerned produces a pixel defect on the drawn circuit pattern. Accordingly, even if only one of the optical modulation elements malfunctions, it is necessary to exchange the exposure unit with a new exposure unit before a circuit pattern can be drawn without any pixel defect.

SUMMARY OF THE INVENTION

Therefore, an object of the present invention is to provide a multi-exposure drawing method for drawing a pattern on a surface of a workpiece, using an exposure unit including a plurality of optical modulation elements arranged in a matrix manner, which is constituted so that the various drawbacks involved in the "step & repeat" method can be completely eliminated.

Another object of the present invention is to provide a multi-exposure drawing apparatus in which the aforesaid multi-exposure drawing method is executed.

In accordance with an aspect of the present invention, there is provided a multi-exposure drawing method of drawing a pattern on a drawing surface, using an exposure unit including a plurality of optical modulation elements arranged in a matrix manner. In this method, the exposure unit is continuously and relatively moving at a constant velocity with respect to the drawing surface in an array-direction on a matrix-arrangement of the optical modulation elements. Optical modulation elements, which are spaced at a regular interval in an alignment of optical modulation elements along the array-direction, are successively and selectively driven based on a same bit datum to thereby modulate a light beam made incident thereon, whenever the exposure unit is moved by a distance corresponding to the regular interval, resulting in production of a pixel dot on the drawing surface in a multi-exposure manner by the successively-modulated light beams. An exposure time for producing the pixel dot by each of the successively-modulated light beams is smaller than a time when the exposure unit is moved by a distance corresponding to a size of the pixel dot.

Preferably, the distance corresponding to the regular interval may be equivalent to an integer-multiple of the size of the pixel dot. Also, preferably a number of exposure times for producing the pixel dot on the drawing surface by the successively-modulated light beams is equivalent to a quotient which is obtained by dividing a length of the alignment of optical modulation elements by the distance corresponding to the regular interval.

According to another aspect of the present invention, there is provided a multi-exposure drawing apparatus that draws a pattern on a drawing surface, using an exposure unit including a plurality of optical modulation elements arranged in a matrix manner. In this apparatus, a movement system continuously and relatively moves the exposure unit at a constant velocity with respect to the drawing surface in an array-direction on a matrix-arrangement of the optical modulation elements. A modulation system successively and selectively drives optical modulation elements, which are spaced at a regular interval in an alignment of optical modulation elements along the array-direction, based on a same bit datum to thereby modulate a light beam made incident thereon, whenever the exposure unit is moved by a distance corresponding to the regular interval, resulting in production of a pixel dot on the drawing surface in a multi-exposure manner by the successively-modulated light beams. A control system controls the movement system and the modulation system so that an exposure time for producing the pixel dot by each of the successively-modulated light beams becomes smaller than a time when the exposure unit is moved by a distance corresponding to a size of the pixel dot.

The modulation system may include an optical focussing system that forms the pixel dot on the drawing surface with the modulated light beam at a size the same as that of a corresponding optical modulation element, whereby the distance corresponding to the regular interval is equivalent to an integer-multiple of the size of the pixel dot. Also, due to the existence of the optical focussing system, the number of exposure times for producing the pixel dot on the drawing surface by the successively-modulated light beams is equivalent to a quotient which is obtained by dividing a length of the alignment of optical modulation elements by the distance corresponding to the regular interval.

BRIEF DESCRIPTION OF THE DRAWINGS

The aforesaid objects and other objects of the invention will be better understood from the following descriptions, with reference to the accompanying drawings, in which.

DESCRIPTION OF THE PREFERRED EMBODIMENTS

Figure 1:
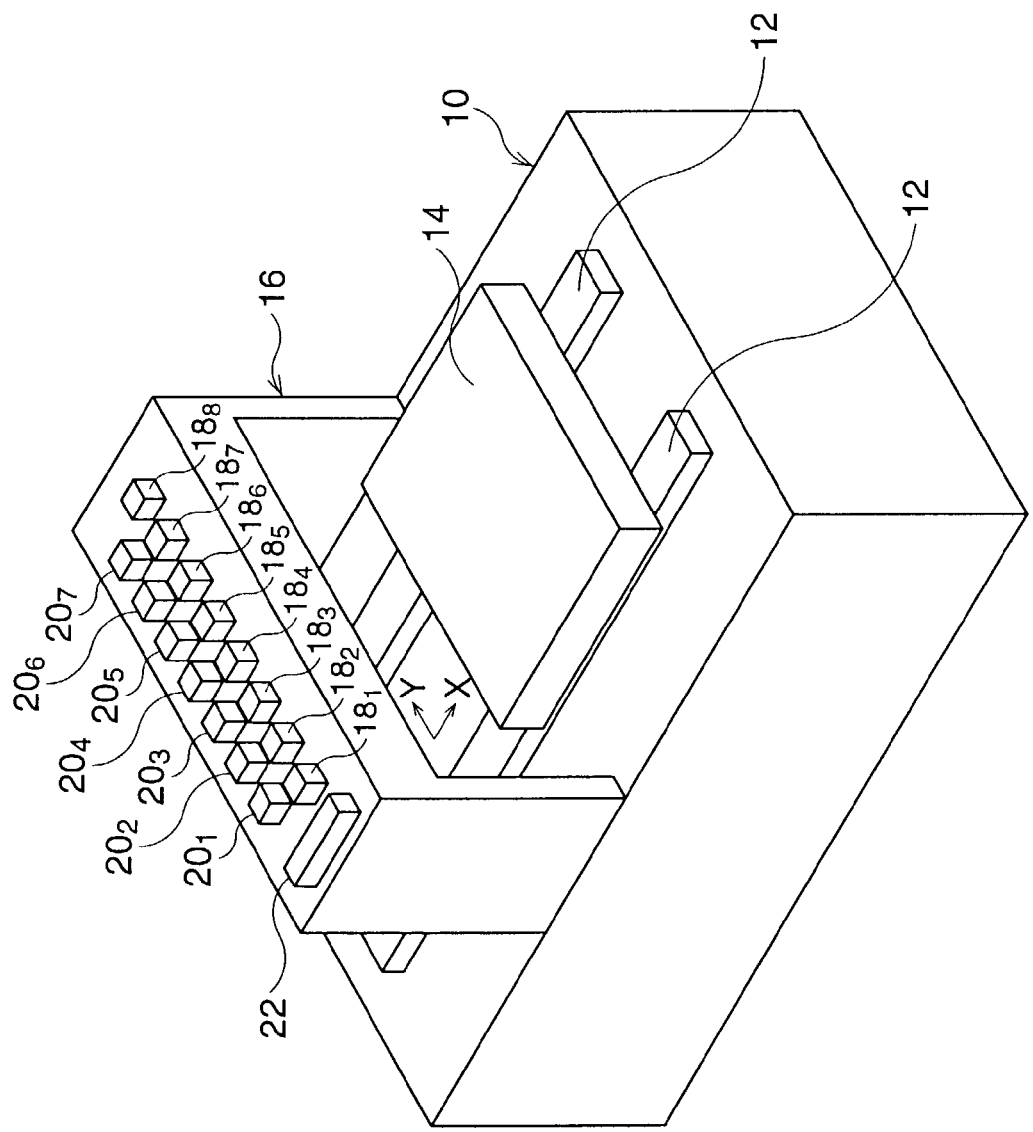
FIG. 1 is a perspective view schematically showing a multi-exposure drawing apparatus according to the present invention.

FIG. 1 schematically and perspectively shows an embodiment of the multi-exposure drawing apparatus according to the present invention, which is constituted to directly draw a circuit pattern on a photoresist layer formed on a suitable substrate, for manufacturing a printed circuit board.

As shown in FIG. 1, the multi-exposure drawing apparatus comprises a base structure 10 installed on a floor, a pair of guide rails 12 laid on the base structure 10, and a drawing table movably placed on the pair of guide rails 12. Although not illustrated in FIG. 1, the drawing table 14 is moved along the pair of guide rails 12 by a drive motor, such as a stepping motor, a servo motor or the like through a suitable drive mechanism, such as a ball-screw mechanism, and a workpiece carrying a photoresist layer is mounted and fixed on the drawing table 14 using suitable clamps.

The apparatus further comprises a bridge-like structure 16, erected so as to straddle the pair of guide rails 12 on the base structure 10, and respective first and second arrays of exposure units $18_1$ to $18_8$ and $20_1$ to $20_7$ provided on the top of the bridge-like structure 16. These exposure units $18_1$ to $18_8$ and $20_1$ to $20_7$ are identical to each other. As shown in FIG. 1, the first array includes eight exposure units $18_1$ to $18_8$ aligned with each other in a direction perpendicular to the movement direction of the drawing table 14 Similarly, the second array includes seven exposure units $20_1$ to $20_7$ aligned with each other in a direction perpendicular to the movement direction of the drawing table 14. The alignment of both the exposure units $18_1$ to $18_8$ and the exposure units $20_1$ to $20_7$ is carried out at an array pitch corresponding to a distance which is twice as long as the lateral width of each exposure unit, but the exposure units $18_1$ to $18_8$ and the exposure units $20_1$ to $20_7$ are aligned so as to be staggered by an amount equal to a one-half times the array pitch with respect to each other, as is apparent from FIG. 1.

In this embodiment, each of the exposure units $18_1$ to $18_8$ and $20_1$ to $20_7$ comprises a digital micro-mirror device (DMD) unit having a reflecting surface which is formed from a plurality of micro-mirror elements arranged in a 1024×1280 matrix manner. Each of the DMD units $18_1$ to $18_8$ and $20_1$ to $20_7$ is oriented so that an alignment of 1024 micro-mirror elements runs along the movement direction of the drawing table 14, i.e. that the alignment of 1280 micro-mirror elements is perpendicular to the movement direction of the drawing table 14.

The multi-exposure drawing apparatus is provided with a light source device 22 mounted on the top of the bridge-like structure 16, and the light source device 22 contains a plurality of light emitting diodes (LED). The light source device 22 has an optical condenser lens system for collecting light emitted by the LED's, and an optical collimating lens system for outputting the collected light as a parallel light beam. Although not illustrated in FIG. 1, each of the DMD units $18_1$ to $18_8$ and $20_1$ to $20_7$ is optically connected to the light source device 22 through the intermediary of fifteen optical fiber cables. In particular, the light source device 22 has a light beam emitting port to which ends of the fifteen optical fiber cables are optically connected, and the other end of each optical fiber cable is connected to a light receiving port of a corresponding DMD unit ($18_1, \ldots, 18_8$; $20_1, \ldots, 20_7$).

Figure 2:
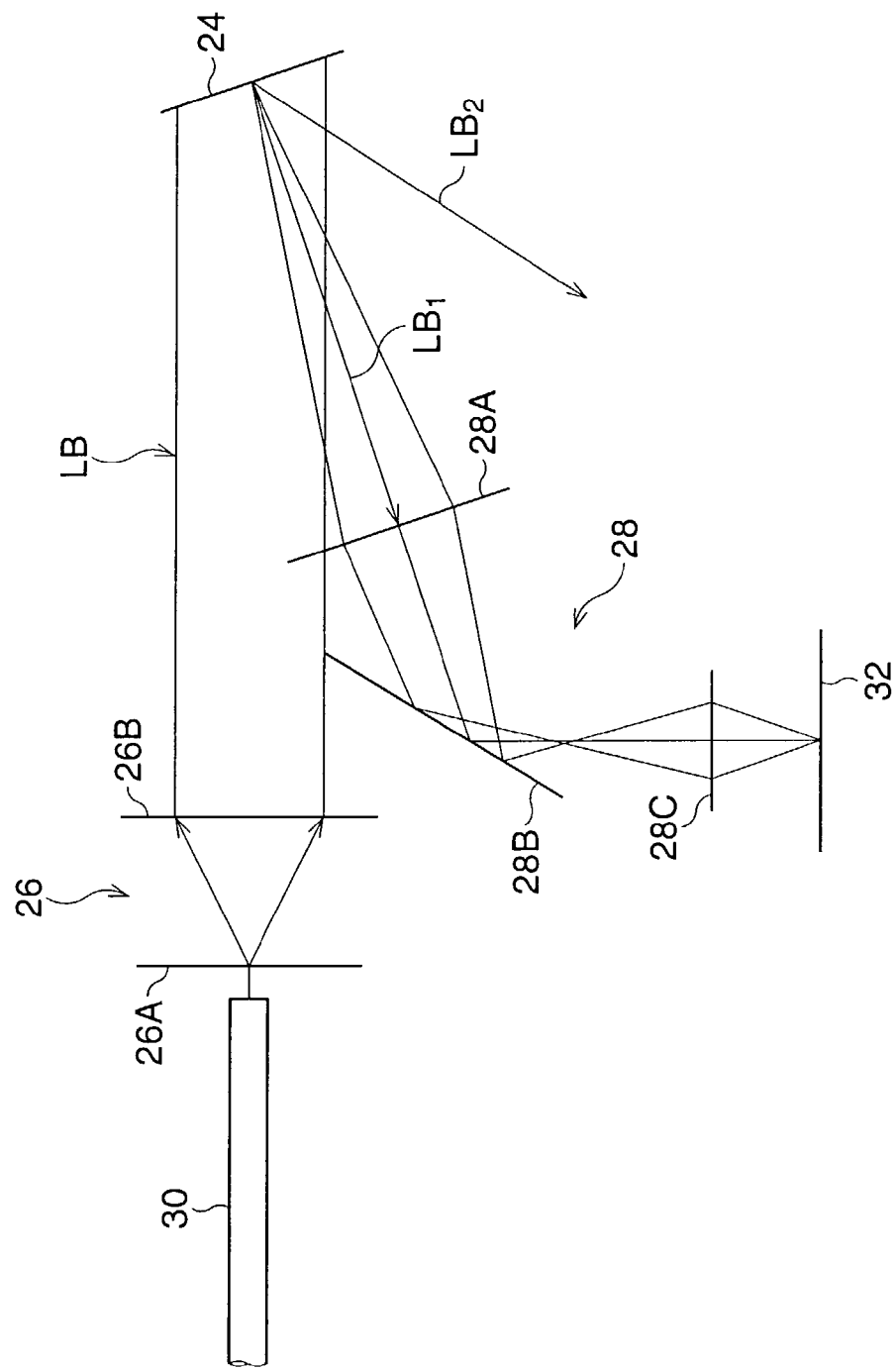
FIG. 2 is a conceptual view for explaining a function of a digital micro-mirror device (DMD) unit used in the multi-exposure drawing apparatus shown in FIG. 1.

Referring to FIG. 2, a function of each DMD unit ($18_1, \ldots, 18_8$; $20_1, \ldots, 20_7$) is conceptually illustrated. In this drawing, reference 24 indicates a reflecting surface of each DMD unit, and the reflecting surface 24 is formed from the 1024×1280 micro-mirror elements, as already stated. Each DMD unit ($18_1, \ldots, 18_8$; $20_1, \ldots, 20_7$) is provided with an illuminating lens system, generally indicated by reference 26, and a focussing lens system, generally indicated by reference 28. Note, in FIG. 2, reference 30 indicates an optical fiber cable extending from the light source device 22.

The illuminating lens system 26 includes a convex lens 26A and a collimating lens 26B optically associated with each other, as shown in FIG. 2, and the convex lens 26A is optically connected with the optical fiber cable 30. The light beam, emitted from the optical fiber cable 30, is first spread by the convex lens 26A, and the spread light is then shaped as a parallel light beam LB by collimating lens 26B, so that the reflecting surface 24 of each DMD unit ($18_1, \ldots, 18_8$; $20_1, \ldots, 20_7$) is uniformly illuminated with the parallel light beam LB. The focussing lens system 28 includes a first convex lens 28A, a reflector 28B, and a second convex lens 28C optically associated with each other, and features a magnifying power of "1".

In the DMD unit ($18_1, \ldots, 18_8$; $20_1, \ldots, 20_7$), each of the micro-mirror elements is movable between a first reflecting position and a second reflecting position. While the light beam LB is received by the reflecting surface 24 of the DMD unit, the micro-mirror element reflects the received light at the first reflecting position such that it is introduced into the focussing lens system 28, and the micro-mirror element reflects the received light at the second reflecting position such that it deviates from the focussing lens system 28. In FIG. 2, the light, introduced into the focussing lens system 28, is shown as a first reflected light beam $LB_1$, and the light, deviating from the focussing lens system 28, is shown as a second reflected light beam $LB_2$. In short, each of the micro-mirror elements serves as an optical modulation element.

Note, the components of the light beam $LB_1$, reflected by all the micro-mirror elements of the fifteen DMD units $18_1$ to $18_8$ and $20_1$ to $20_7$, have substantially the same intensity of light.

In FIG. 2, reference 32 indicates a drawing surface of the photoresist layer of the workpiece placed on the drawing table 14, the reflecting face of each micro-mirror element is focused as an exposure zone on the drawing surface 32 by the focussing lens system 28 when the micro-mirror element is placed at the first reflecting position. For example, when each of the micro-mirror elements, included in the DMD units ($18_1, \ldots, 18_8$; $20_1, \ldots, 20_7$), has a size of 20×20 µm, the exposure zone is obtained as a pixel dot having a size of 20×20 µm on the drawing surface 23, due to the magnifying power of "1" of the focussing lens system 28. Namely, in this embodiment, a circuit pattern is drawn on the drawing surface 32 by pixel dots having a size of 20×20 µm.

In the DMD units ($18_1, \ldots, 18_8$; $20_1, \ldots, 20_7$), each micro-mirror element is usually positioned at the second reflecting position or non-exposure position. By driving the micro-mirror element from the second reflecting position or non-exposure position to the first reflecting position or exposure position, an exposure operation is performed, thereby producing an exposure zone or pixel dot on the drawing surface 32. After the exposure operation is finished, the micro-mirror element concerned is returned from the exposure position to the non-exposure position. The movement of the micro-mirror element from the non-exposure position to the exposure position is performed in accordance with circuit pattern data (raster-graphic data), as stated in detail hereinafter.

Note, obviously, the light beam $LB_2$, deviating from the focussing lens system 28, is suitably dealt with so that it cannot reach the drawing surface 32.

When all the micro-mirror elements included in each DMD unit ($18_1, \ldots, 18_8$; $20_1, \ldots, 20_7$) are driven from the non-exposure position to the exposure position, a full exposure zone is formed on the drawing surface 32 by the focussing lens system 28. Of course, the full exposure zone is formed by the number of 1024×1280 exposure zones or pixel dots, and the size of the full exposure zone is (1024× 20)×(1280×20) µm.

Figure 3:
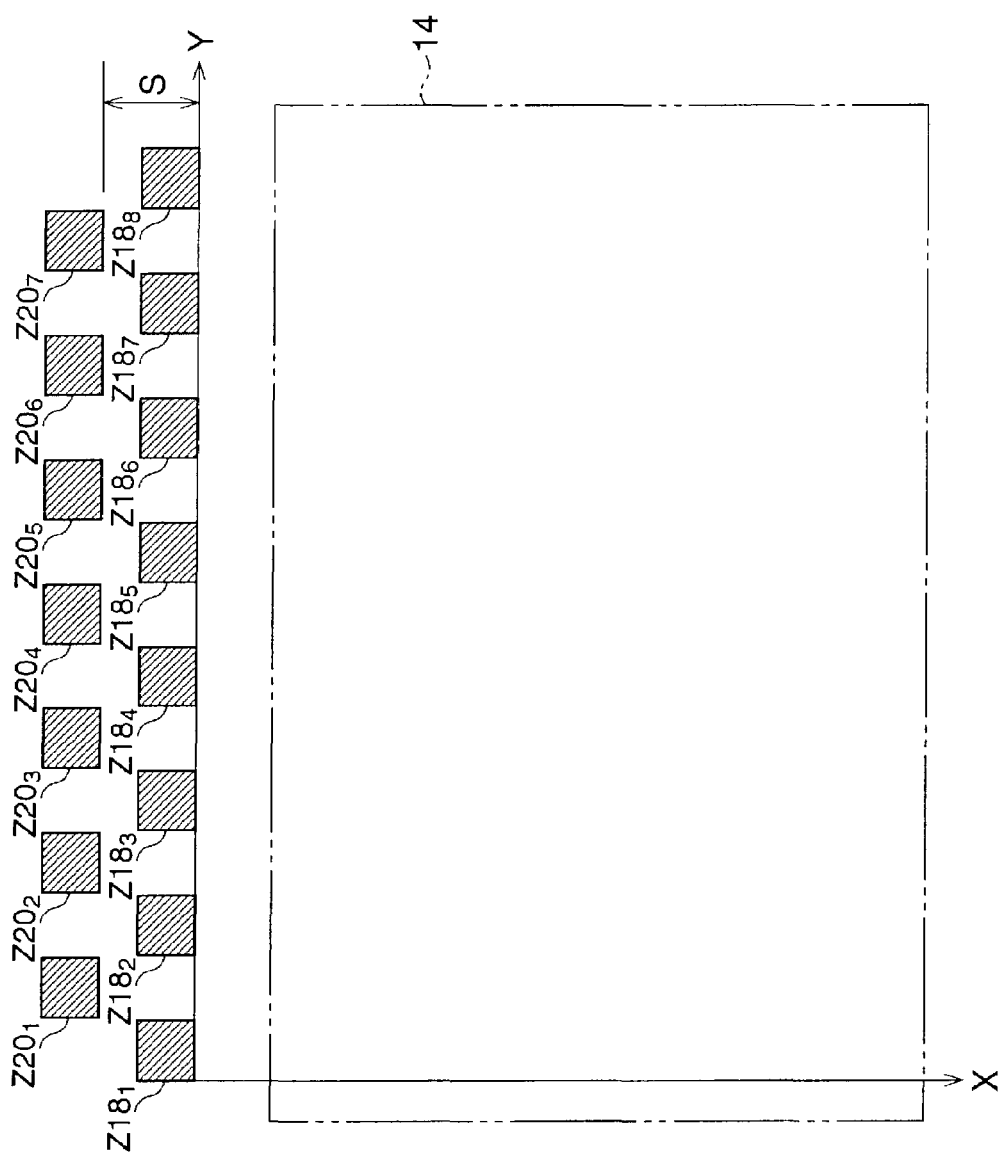
FIG. 3 is a conceptual view showing an arrangement of fifteen full exposure zones projected by fifteen DMD units, used in the multi-exposure drawing apparatus, on a geometric surface including a drawing surface, together with an X-Y coordinate system defined on the geometric surface.
Figure 4:
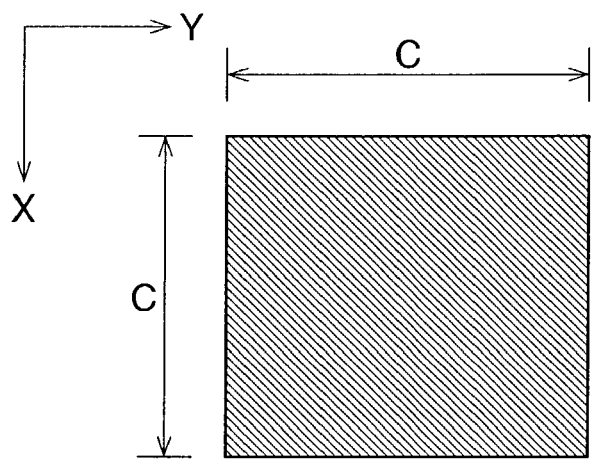
FIG. 4 is a conceptual view showing an exposure zone produced by a micro-mirror element of a DMD unit on a drawing surface.

Referring to FIG. 3, fifteen full exposure zones $Z18_1$ to $Z18_8$ and $Z20_1$ to $Z20_7$ are conceptually shown as being projected on a geometric surface including the drawing surface 32 (FIG. 2). Of course, the respective eight full exposure zones $Z18_1$ to $Z18_8$ are derived from the DMD units $18_1$ to $18_8$ included in the first array, and the respective seven full exposure zones $Z20_1$ to $Z20_7$ are derived from the DMD units $20_1$ to $20_7$ included in the second array. Also, in FIG. 3, to clarify the positional relationship between the drawing table 14 and the fifteen full exposure zones $Z18_1$ to $Z18_8$ and $Z20_1$ to $Z20_7$, the table 14 is shown by a phantom line.

As shown in FIGS. 1 and 3, for convenience of the explanations described later, a two-dimensional X-Y coordinate system is defined on the geometric surface including the drawing surface 32. As is apparent from FIG. 3, the Y-axis of the X-Y coordinate system extends so as to be contiguous to the leading edges of the eight full exposure zones $Z18_1$ to $Z18_8$, and the origin of the coordinate system is at an outer corner of the leading edge of the full exposure zone $Z18_1$, with the X-axis of the X-Y coordinate system extending in the movement direction of the drawing table 14.

In a drawing operation using the apparatus, the drawing table 14 is moved at a constant velocity in the minus direction of the X-axis of the coordinate system. During the movement of the drawing table 14, the micro-mirror elements included in each DMD unit ($18_1$, . . . , $18_8$; $20_1$, . . . , $20_7$) are selectively driven, and thus the drawing surface 32 is scanned with light beams $LB_1$ reflected by the operated micro-mirror elements.

When the drawing surface 32 reaches the Y-axis of the coordinate system, first, the selective operation of the micro-mirror elements, included in the first array of the DMD units $18_1$ to $18_8$, is started, and then the selective operation of the micro-mirror elements, included in the second array of DMD units $20_1$ to $20_7$, is started after the drawing table 14 is moved by a distance "S" between the leading edges of the eight full exposure zones $Z18_1$ to $Z18_8$ and the leading edges of the seven full exposure zones $Z20_1$ to $Z20_8$ (FIG. 3). Thus, the fifteen full exposure zones $Z18_1$ to $Z18_8$ and $Z20_1$ to $Z20_7$ can be aligned with each other on the drawing surface 32 along the Y-axis of the coordinate system. Namely, when a circuit pattern is drawn using the fifteen DMD units $18_1$ to $18_8$ and $20_1$ to $20_7$ on the drawing surface 32, each lateral drawing line of the drawn circuit pattern, extending along the Y-axis of the coordinate system, is formed by the number of 1280×15 pixels.

According to the present invention, the multi-exposure drawing apparatus is characterized in that the micro-mirror elements are selectively driven in accordance with circuit pattern data (raster-graphic data) while continuously moving the drawing table 14 with respect to the DMD units $18_1$ to $18_8$ and $20_1$ to $20_7$ during a drawing operation.

A principle of the present invention for drawing a circuit pattern on the continuously-moving drawing surface 32 is explained below.

First, with reference to FIGS. 4 to 7, it will be explained how one-pixel dot is defined on the continuously-moving drawing surface 32 by a light beam $LB_1$ reflected from a micro-mirror element which is moved to the exposure position. As stated above, by driving a micro-mirror element from the non-exposure position to the exposure position, an exposure zone is produced on the continuously-moving drawing surface 32, as shown by the hatched area in FIG. 4. The exposure zone has a C×C size, and this size is the same as that of the micro-mirror element, because of the magnifying power of "1" of the focussing lens system 28. Namely, the dimension "C" is equivalent to 20 µm.

When the drawing surface 32 is moved by a distance "d" smaller than the dimension "C=20 µm", the exposure operation is stopped, i.e. the micro-mirror element is returned from the exposure position to the non-exposure position. Thus, an exposure time is defined as the time when the drawing surface 32 is moved by the distance "d" (d<C).

Figure 5:
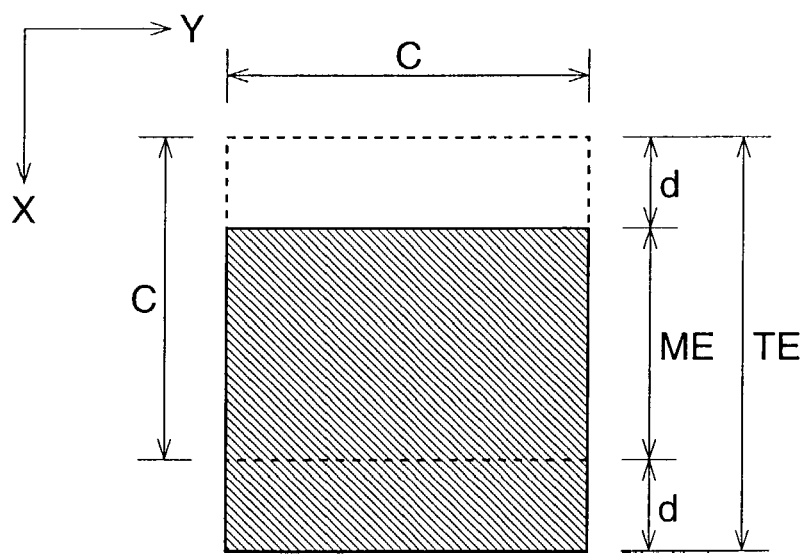
FIG. 5 is a conceptual view, similar to FIG. 4, showing the exposure zone on the drawing surface continuously moved by a distance "d"

While the drawing surface 32 is moved by the distance "d", the exposure zone (hatching area) is also shifted on the drawing surface 32 by the same distance "d" in the plus direction of the X-axis of the coordinate system, and thus a total exposure extent "TE" is defined as shown in FIG. 5 (TE=C+d). The total exposure extent "TE" is featured by a trailing section, a leading section, and a maximum exposure section "ME" between the trailing and leading sections (TE=C−d). Note, the trailing section is defined as the extent to which the trailing edge of the exposure zone is shifted by the distance "d", and the leading section is defined as the extent to which the leading edge of the exposure zone is shifted by the distance "d".

Figure 6:
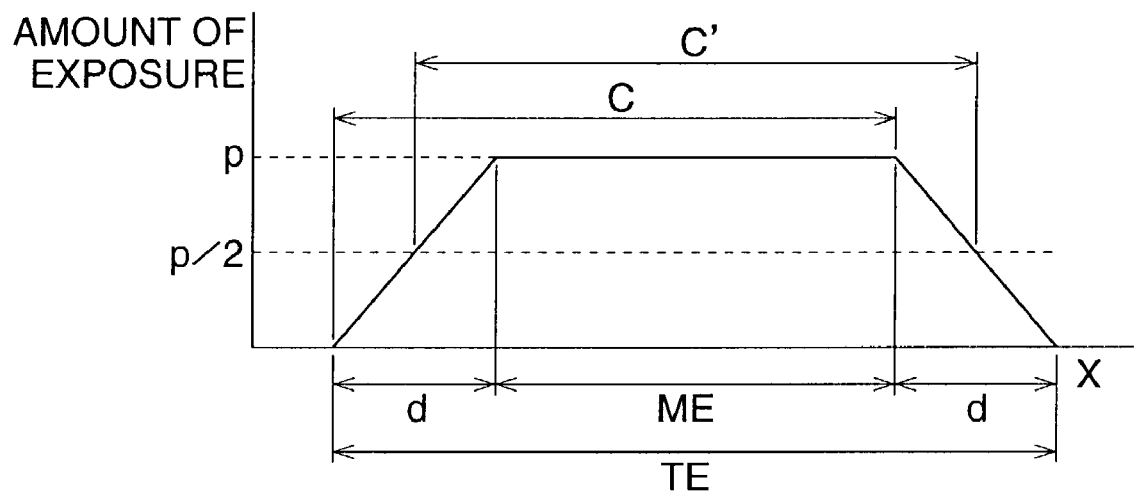
FIG. 6 is a graph showing an exposure distribution of a total exposure extent obtained by the continuous movement of the drawing surface.

Referring to the graph of FIG. 6, an exposure distribution of the total exposure extent "TE" is shown when taken along the plus direction of the X-axis of the coordinate system. As is apparent from this graph, in the trailing section, the amount of exposure is gradually increased from a zero exposure level to a maximum exposure level "p" of the maximum exposure section "ME", and, in the leading section, the amount of exposure is gradually decreased from the maximum exposure level "p" to the zero exposure level.

Figure 7:
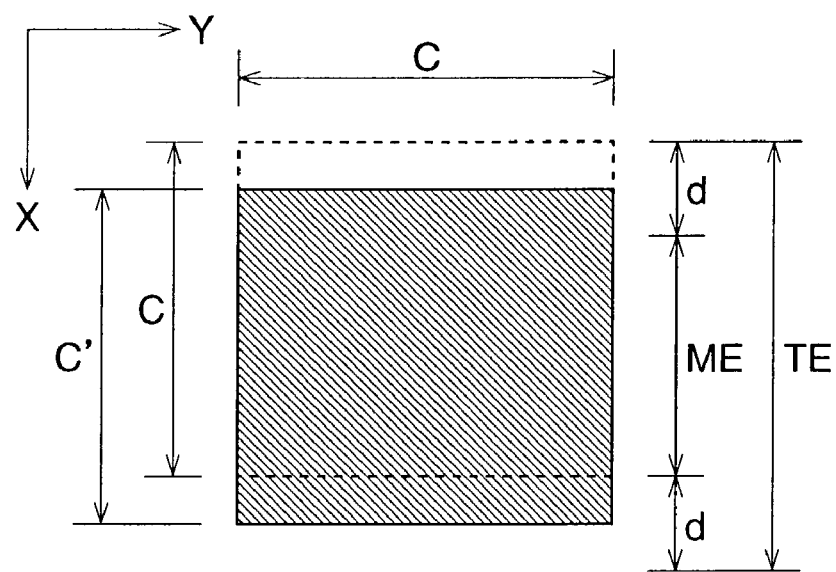
FIG. 7 is a conceptual view showing one pixel dot defined by the exposure zone produced on the continuously-moving drawing surface.

When the exposure distribution is clipped at a half of the maximum exposure level "p", an exposure extent C', having the half exposure level "p/2", is defined, and is equivalent to the dimension "C" (C'=C). Thus, the exposure zone, having the C'×C size, is defined as one pixel dot on the drawing surface 32, as shown in FIG. 7.

Figure 8:
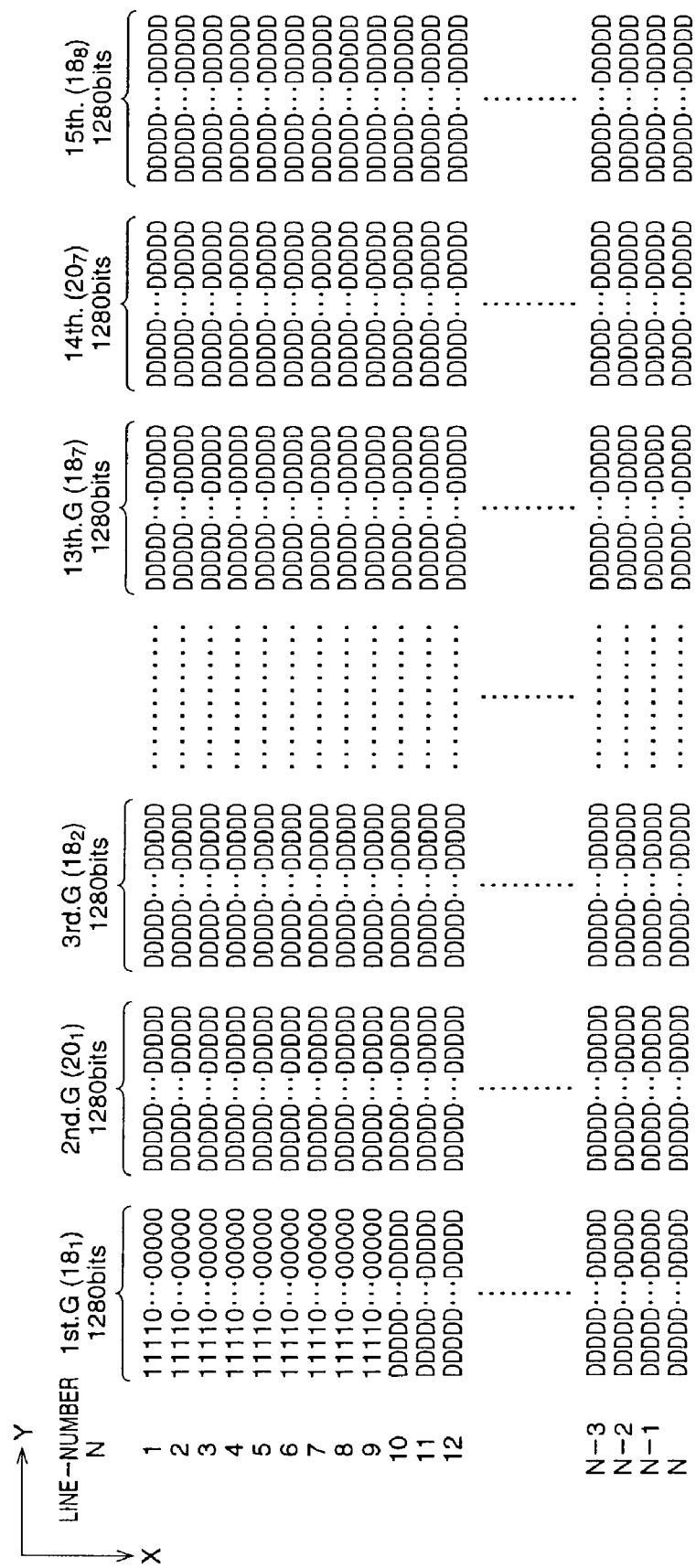
FIG. 8 is a conceptual view showing raster-graphic data developed and stored in a bit-map memory incorporated in the multi-exposure drawing apparatus.

Referring to FIG. 8, a part of the circuit pattern data (raster-graphic data), stored and developed in a bit-map memory, is conceptually shown. The circuit pattern data comprises a plurality of lateral bit-data lines, indicated by a line-number "N", and each line includes 1280×15 bit-data. The lateral bit-data lines correspond to lateral drawing lines to be successively drawn on the drawing surface 32 along the Y-axis of the coordinate system. Namely, a lateral bit-data line, indicated by a line-number "N", corresponds to the number of a lateral drawing line to be drawn on the drawing surface 32.

As shown in FIG. 8, the 1280×15 bit-data, included in each lateral bit-data line, are divided into fifteen groups: first, second, third, . . . , thirteenth, fourteenth, and fifteenth groups, and each group includes 1280 bit-data. The DMD units $18_1$ to $18_8$ included in the first array are operated in accordance with the bit-data included in the respective odd-numbered groups (1st.G, 3rd.G, . . . , 13th.G, and 15th.G), and the DMD units $20_1$ to $20_7$ are operated in accordance with the bit-data included in the respective even-numbered groups (2nd.G, 4th.G, . . . , 12th.G, and 14th.G).

To concretely and representatively explain the operation of the DMD unit $18_1$ below, as shown in FIG. 8 by way of example, a value of "1" is given to all the spearheaded 4 bit-data of the nine lateral bit-data lines, numbered by the line-numbers "N=1" to "N=9" and included in the first group (1st.G), and a value of "0" is given to all the remaining bit-data, numbered by the line-numbers "N=1" to "N=9" and included in the first group (1st.G). Note, in FIG. 8, each reference "D" represents one bit-datum, to which a value of either "0" or "1" is given.

Figure 9:
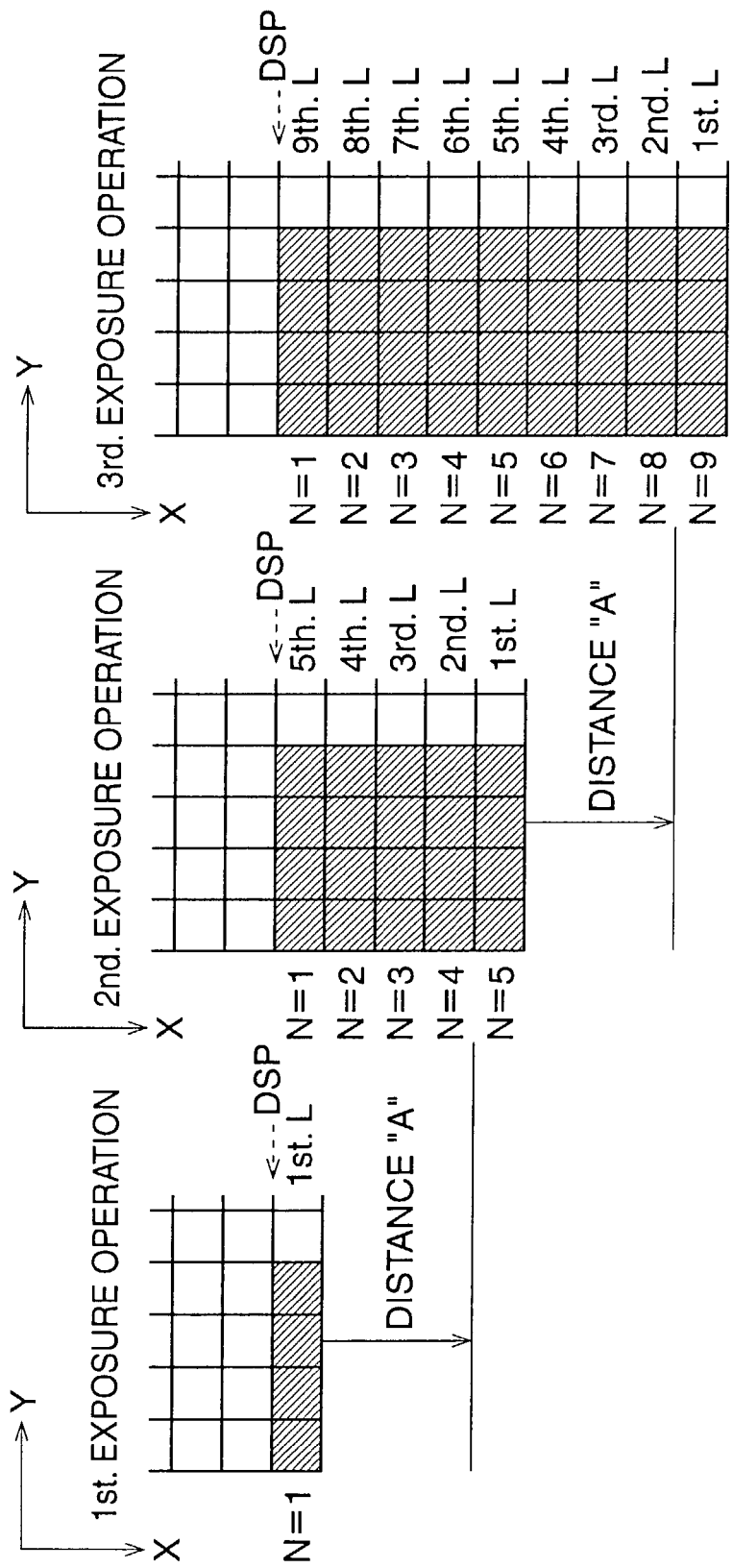
FIG. 9 is a conceptual view for explaining the principle behind the drawing process according to the present invention.

Referring to FIG. 9, a drawing process, in which the DMD unit $18_1$ is operated in accordance with the bit-data included in the nine lateral bit-data lines "1" to "9", is conceptually shown. Note, in reality, although the drawing table 14, and therefore, the drawing surface 32 is moved in the minus direction of the X-axis of the coordinate system, it is supposed that the DMD unit $18_1$ is moved in the plus direction of the X-axis of the coordinate system in the explanation mentioned below with reference to FIG. 9.

When the DMD unit $18_1$ has reached a given drawing-start position (indicated by reference "DSP" in FIG. 9) on the drawing surface 32, a first exposure operation is performed. In the first exposure operation, the respective 1280 micro-mirror elements, included in the first line of the DMD unit $18_1$, are operated in accordance with the 1280 bit-data [11110 . . . 00000] included in the first lateral bit-data line "N=1". Namely, only the spearheaded four micro-mirror elements, included in the first line of the DMD unit $18_1$, are driven based on the spearheaded four bit-data [1111] included in the first lateral line "N=1", whereby each of the spearheaded four micro-mirror elements is driven from the non-exposure position to the exposure position.

When the DMD unit $18_1$ is moved from the drawing-start position "DSP" by the distance "d" (d<D), each of the spearheaded four micro-mirror elements concerned is returned from the exposure position to the non-exposure position, and thus the first exposure operation is finished, to thereby produce four exposure zones or four pixel dots on the drawing surface 32, as shown by the hatched areas in FIG. 9 (1st. EXPOSURE OPERATION).

Thereafter, when the DMD unit $18_1$ is moved from the drawing-start position "DSP" by a distance "A", which corresponds to an integer-multiple of the dimension "C", a second exposure operation is performed. In the example shown in FIG. 9, since the distance "A" is equivalent to a multiple of four of the dimension "C" (A=4*C), the 1280×5 micro-mirror elements, included in the first, second, third, fourth, and fifth lines of the DMD unit $18_1$, are respectively operated in accordance with the 1280×5 bit-data included in the fifth line "N=5", fourth line "N=4", third line "N=3", second line "N=2", and first line "N=1".

In particular, in the second exposure operation, the 1280 micro-mirror elements, included in the first line of the DMD unit $18_1$, are respectively operated in accordance with the 1280 bit-data [11110 . . . 00000] included in the fifth line "N=5"; the 1280 micro-mirror elements, included in the second line of the DMD unit $18_1$, are respectively operated in accordance with the 1280 bit-data [11110 . . . 00000] included in the fourth line "N=4"; the 1280 micro-mirror elements, included in the third line of the DMD unit $18_1$, are respectively operated in accordance with the 1280 bit-data [11110 . . . 00000] included in the third line "N=3"; the 1280 micro-mirror elements, included in the fourth line of the DMD unit $18_1$, are respectively operated in accordance with the 1280 bit-data [11110 . . . 00000] included in the second line "N=2"; and the 1280 micro-mirror elements, included in the fifth line of the DMD unit $18_1$, are respectively operated in accordance with the 1280 bit-data [11110 . . . 00000] included in the first line "N=1".

Thus, similar to the first exposure operation, only the spearheaded four micro-mirror elements, included in each of the first, second, third, fourth, and fifth lines of the DMD unit $18_1$, are operated based on the spearheaded four bit-data [1111] included in a corresponding line "N=5", "N=4", "N=3", "N=2", and "N=1", whereby each of the spearheaded micro-mirror elements is driven from the non-exposure position to the exposure position.

After the start of the second exposure operation, when the DMD unit $18_1$ is moved by the distance "d" (d<D), each of the spearheaded micro-mirror elements is returned from the exposure position to the non-exposure position, and thus the second exposure operation is finished, thereby producing 4×5 exposure zones or 4×5 pixel dots on the drawing surface 32, as shown by the hatched areas in FIG. 9 (2nd. EXPOSURE OPERATION).

When the DMD unit $18_1$ is further moved by the distance "A" (A=4*C), i.e. when the DMD unit $18_1$ is moved from the drawing-start position "DSP" by the distance "2*A", a third exposure operation is performed. In the third exposure operation, the 1280×9 micro-mirror elements, included in the first, second, third, fourth, fifth, sixth, seventh, eighth, and ninth lines of the DMD unit $18_1$, are respectively operated in accordance with the 1280×9 bit-data included in the ninth line "N=9", eighth line "N=8", seventh line "N=7", sixth line "N=6", the fifth line "N=5", fourth line "N=4", third line "N=3", second line "N=2", and first line "N=1".

In particular, in the third exposure operation, the 1280 micro-mirror elements, included in the first line of the DMD unit $18_1$, are respectively operated in accordance with the 1280 bit-data [11110 . . . 00000] included in the ninth line "N=9"; the 1280 micro-mirror elements, included in the second line of the DMD unit $18_1$, are respectively operated in accordance with the 1280 bit-data [11110 . . . 00000] included in the eighth line "N=8"; the 1280 micro-mirror elements, included in the third line of the DMD unit $18_1$, are respectively operated in accordance with the 1280 bit-data [11110 . . . 00000] included in the seventh line "N=7"; the 1280 micro-mirror elements, included in the fourth line of the DMD unit $18_1$, are respectively operated in accordance with the 1280 bit-data [11110 . . . 00000] included in the sixth line "N=6"; and the 1280 micro-mirror elements, included in the fifth line of the DMD unit $18_1$, are respectively operated in accordance with the 1280 bit-data [11110 . . . 00000] included in the fifth line "N=5"; the 1280 micro-mirror elements, included in the sixth line of the DMD unit $18_1$, are respectively operated in accordance with the 1280 bit-data [11110 . . . 00000] included in the fourth line "N=4"; the 1280 micro-mirror elements, included in the seventh line of the DMD unit $18_1$, are respectively operated in accordance with the 1280 bit-data [11110 . . . 00000] included in the third line "N=3"; the 1280 micro-mirror elements, included in the eighth line of the DMD unit $18_1$, are respectively operated in accordance with the 1280 bit-data [11110 . . . 0000] included in the second line "N=2"; and the 1280 micro-mirror elements, included in the ninth line of the DMD unit $18_1$, are respectively operated in accordance with the 1280 bit-data [11110 . . . 00000] included in the first line "N=1".

After the start of the third exposure operation, when the DMD unit $18_1$ is moved by the distance "d" (d<D), each of the spearheaded micro-mirror elements is returned from the exposure position to the non-exposure position, and thus the third exposure operation is finished, thereby producing 4×9 exposure zones or 4×9 pixel dots on the drawing surface 32, as shown by the hatched areas in FIG. 9 (3rd. EXPOSURE OPERATION).

Similarly, whenever the DMD unit $18_1$ is moved from the drawing-start position "DSP" in the plus direction of the X-axis of the coordinate system by an integer-multiple of the distance "A" (n*A: n≧=3, 4, 5, . . . ), an exposure operation is repeatedly performed, whereby the exposure zones or pixel dots are produced in a multi-exposure manner.

For example, when the second exposure operation is finished, the four exposure zones or pixel dots, obtained by the first exposure operation, are subjected to a double-exposure by the spearheaded four micro-mirror elements included in the respective first and fifth lines of the DMD unit $18_1$. Also, when the third exposure operation is finished, the four exposure zones or pixel dots concerned, obtained by the first exposure operation, are subjected to a triple-exposure by the spearheaded four micro-mirror elements included in the respective first, fifth and ninth lines of the DMD unit $18_1$.

On the other hand, when the third exposure operation is finished, the 4×4 exposure zones or 4×4 pixel dots, initially obtained by the second exposure operation, are subjected to a double-exposure by the spearheaded four micro-mirror elements included in the respective first, second, third, fourth, fifth, sixth, seventh, and eighth lines of the DMD unit $18_1$.

Figure 10:
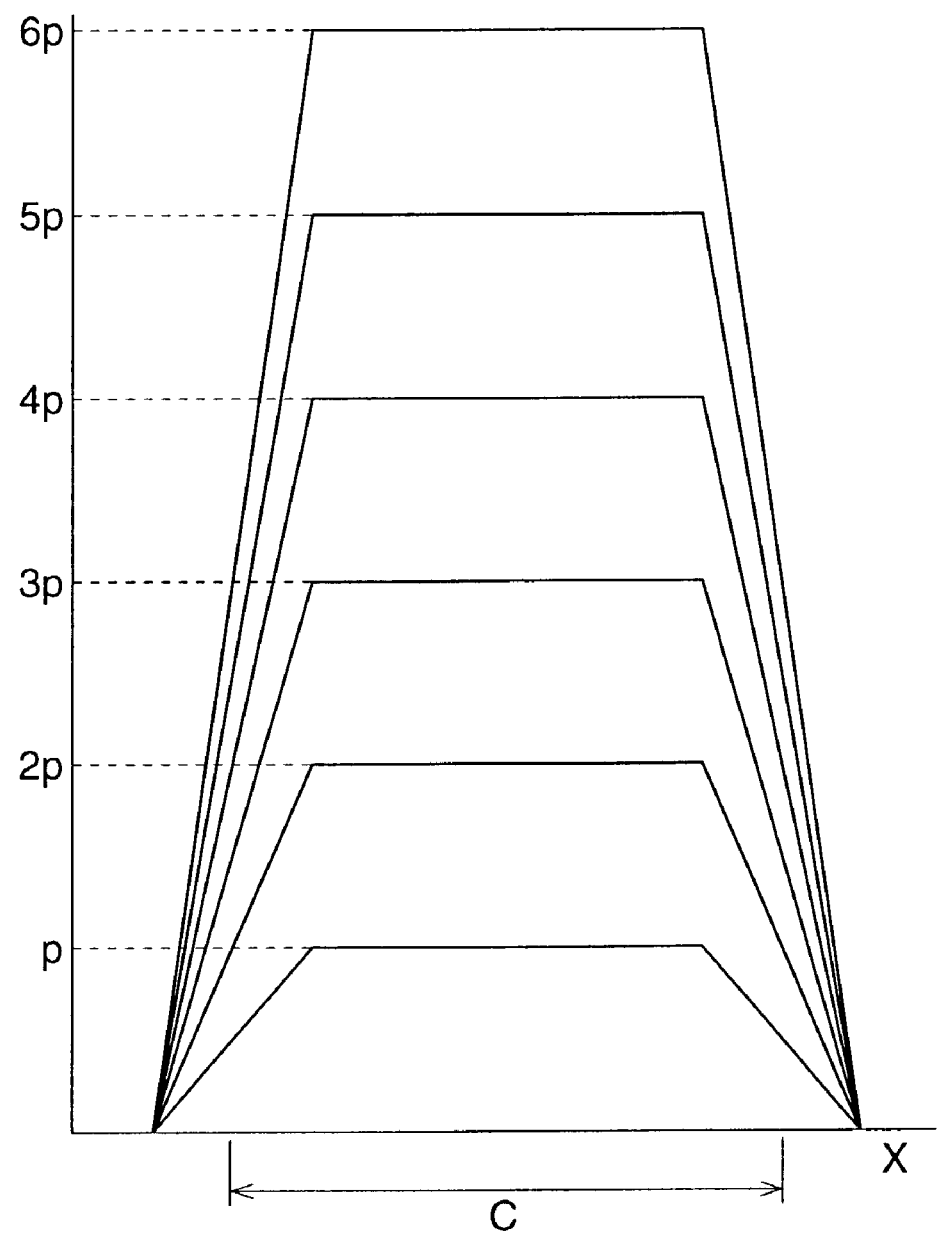
FIG. 10 is a graph showing the total exposure level of an exposure zone or pixel dot produced on the drawing surface by repeatedly performing an exposure operation six times.

For example, when an exposure zone or pixel dot is formed by repeatedly performing the exposure operation six times, the total exposure level on the exposure zone or pixel dot becomes equivalent to "6*p", as shown in a graph of FIG. 10. As stated above, the DMD unit $18_1$ includes 1024×1280 micro-mirror elements. Thus, whenever the drawing surface 32 is moved by the distance "A=4*C", the exposure operation is repeatedly performed, and the number of exposure operations reaches 256 ($^{1024}/_4$). Thus, the total exposure level on each exposure zone or pixel dot is equivalent to "256*p".

The remaining DMD units $18_2$, $18_3$, $18_4$, $18_5$, $18_6$, $18_7$, and $18_8$, included in the first array, are operated in accordance with the 1280×N bit-data, included in the respective third, fifth, seventh, ninth, eleventh, thirteenth, and fifteenth groups (FIG. 8), in substantially the same manner as the DMD unit $18_1$.

Also, the DMD units DMD $20_1$, $20_2$, $20_3$, $20_4$, $20_5$, $20_6$, and $20_7$, included in the second array, are operated in accordance with the 1280×N bit-data, included in the respective second, fourth, sixth, eighth, tenth, twelfth, and fourteenth groups (FIG. 8), in substantially the same manner as the DMD unit $18_1$, except that a start of the exposure operation is delayed by a time during which the drawing surface 32 is moved by the distance "S" between the leading edges of the DMD units $18_1$ to $18_8$ and the leading edges of the DMD units $20_1$ to $20_8$ (FIG. 3).

As is apparent from the foregoing, it is possible to vary the number of exposure operation times by altering the value of the distance "A". For example, if A=2*C, the number of exposure operation times is "512", and, if A=8*C, the number of exposure operation times is "128". The number of exposure operation times is suitably selected based on the sensitivity of the photoresist layer, the light intensity of the light beam $20_1$, and so on, so that a proper exposure level can be obtained for exposure zones or pixel dots to be produced on the drawing surface 32.

Figure 11:
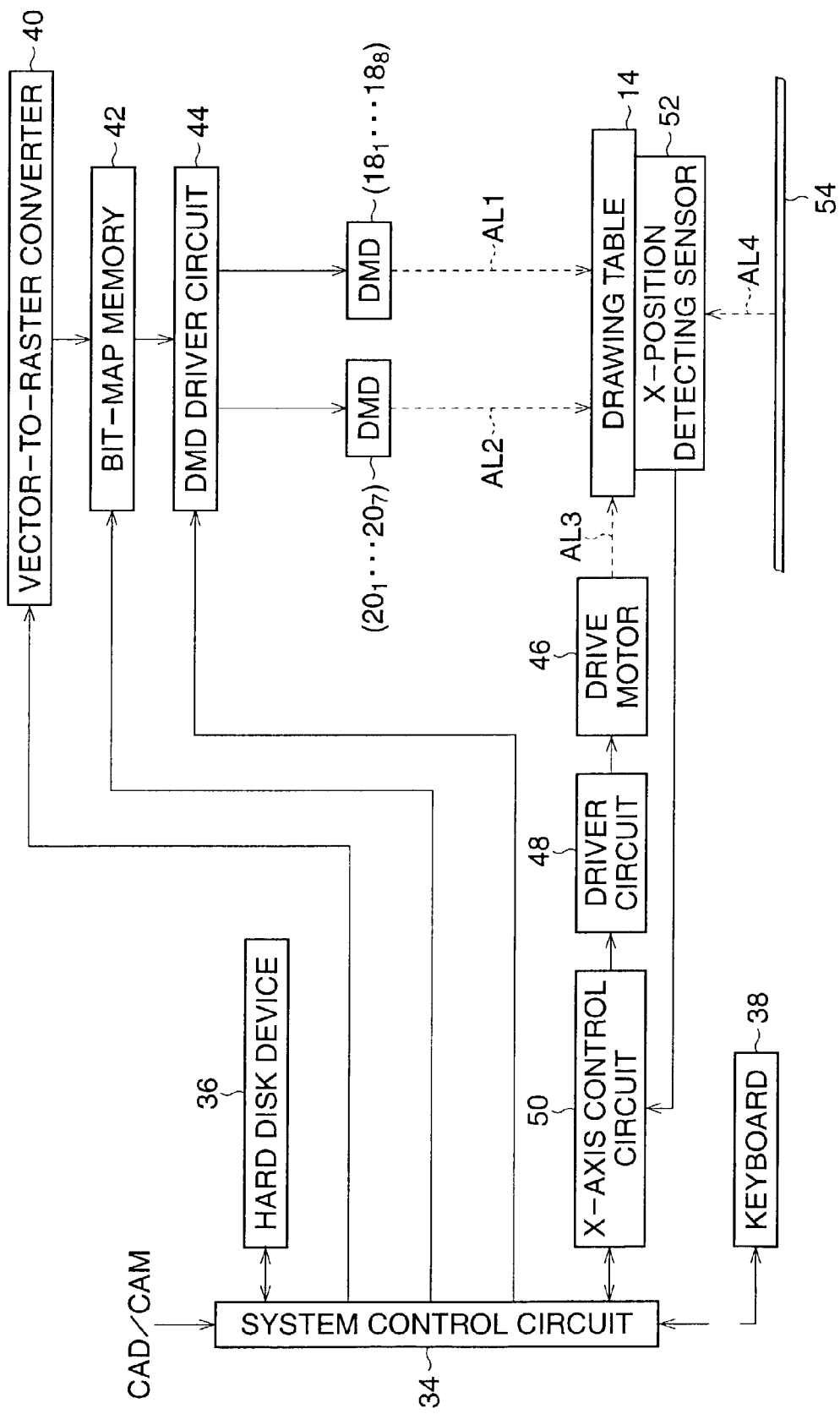
FIG. 11 is a block diagram of the multi-exposure drawing apparatus.

Referring to FIG. 11, a block diagram of the multi-exposure drawing apparatus is schematically shown. The apparatus includes a system control circuit 34 which is constituted by a microcomputer comprising a central processing unit (CPU), a read-only memory (ROM) for storing programs and constants, a random-access memory (RAM) for storing temporary data, and an input/output interface circuit (I/O).

The system control circuit 34 is connected to a LAN (local area network) through the I/O, and is further connected to a CAD (Computer Aided Design) station for designing a circuit pattern and a CAM (Computer Aided Manufacturing) station for editing the designed circuit pattern through the LAN. The circuit pattern is treated as vector-graphic data by the CAD station and/or the CAM station. The vector-graphic data or circuit pattern data is fed from either the CAD station or CAM station to the system control circuit 34 through the LAN, if necessary.

The system control circuit 34 is provided with a hard disk device 36 connected thereto through the I/O. Whenever the system control circuit 34 receives the circuit pattern data (vector-graphic data) from either the CAD station or CAM station, the circuit pattern data is stored in the hard disk device 36. The apparatus includes a keyboard 38 which is connected to the system control circuit 34 through the I/O to input various commands and various data to the system control circuit 34.

The apparatus also includes a vector-to-raster converter 40 and a bit-map memory 42. Prior to a drawing operation, a series of vector-graphic circuit pattern data is read from the hard disk device 36, and is fed to the vector-to-raster converter 40, in which the vector-graphic circuit pattern data is converted into raster-graphic circuit pattern data. The converted raster-graphic circuit pattern data is successively output from the vector-to-raster converter 40 to the bit-map memory 42, in which the raster-graphic circuit pattern data are developed and stored, as shown in FIG. 8.

Note, the reading of the vector-graphic circuit pattern data, the conversion of the vector-graphic circuit pattern data into the raster-graphic circuit pattern data, and the storage of the raster-graphic circuit pattern data in the bit-map memory 42 and so on are performed in accordance with command signals input to the system control circuit 34 by operating the keyboard 38.

As explaining with reference to FIG. 8, each lateral bit-data line, numbered by a line-number "N", includes 1280×15 bit-data, and the 1280×15 bit-data are divided into the fifteen groups: first, second, third, . . . , thirteenth, fourteenth, and fifteenth groups, each group including the 1280 bit-data. Also, as already stated, the DMD units $18_1$ to $18_8$ included in the first array are operated in accordance with the bit-data included in the respective odd-numbered groups (1st.G, 3rd.G, . . . , 13th.G, and 15th.G), and the DMD units $20_1$ to $20_7$ are operated in accordance with the bit-data included in the respective even-numbered groups (2nd.G, 4th.G, . . . , 12th.G, and 14th.G).

The apparatus further includes a DMD driver circuit 44 for operating the DMD units $18_1$ to $18_8$ and $20_1$ to $20_7$. As is apparent from FIG. 11, the DMD units $18_1$ to $18_8$ included in the first array are represented as a block, and the DMD units $20_1$ to $20_7$ included in the second array are also represented as a block. Note, in FIG. 11, the exposure operation, performed by the DMD units $18_1$ to $18_8$, is symbolically represented by the arrow-headed broken line AL1, and the exposure operation, performed by the DMD units $20_1$ to $20_7$, is symbolically represented by the arrow-headed broken line AL2.

During a drawing operation, the 1280 bit-data are read repeatedly from each lateral bit-data line "N" of each group defined in the bit-map memory 42, and the number of reading times of each lateral bit-data line "N" is equivalent to the number of exposure operations for obtaining a proper exposure level for each exposure zone or pixel dot. Also, the reading of the 1280 bit-data from each lateral bit-data line "N" of each group defined in the bit-map memory 42 is controlled in accordance with the movement of the drawing surface 32 in the minus direction of the X-axis of the coordinate system.

In particular, when the drawing surface 32 reaches the drawing-start position "DSP", the 1280 bit-data are read from the first lateral bit-data line "N=1" of each odd-numbered group (1st.G, 3rd.G, . . . , 13th.G, and 15th.G) for the first exposure operation, in which the 1280 micro-mirror elements, included in the first line of each DMD unit ($18_1$, . . . , $18_8$) are operated in accordance with the corresponding 1280 bit-data, as explained with reference to FIG. 9.

When the drawing surface 32 is moved from the drawing-stat position "DSP" by the distance "A", the 1280 bit-data are read from the (A/C+1) lateral bit-data lines "N=1, . . . , (A/C+1)" of each odd-numbered group (1st.G, 3rd.G, . . . , 13th.G, and 15th.G) for the second exposure operation. In the example shown in FIG. 9, since A=4*C, in the second exposure operation, the 1280×5 micro-mirror elements, included in the first, second, third, fourth, and fifth lines of each DMD unit ($18_1$, . . . , $18_8$), are respectively operated in accordance with the 1280×5 bit-data included in the fifth line "N=5", fourth line "N=4", third line "N=3", second line "N=2", and first line "N=1", as explained with reference to FIG. 9.

In general, the number of exposure operations is represented by a variable "i", which is defined with respect to the movement of the drawing surface 32 as follows:

$i=INT[L/A]+1$

Herein: the calculation factor INT[ . . . ] represents the quotient of the bracketed division (if L<A, INT[L/A]=0); and "L" is the movement distance of the drawing surface 32 from the drawing-start position "DSP".

Accordingly, by using the variable "i", a line-number of the lateral bit-data line "N", from which the 1280 bit-data are read last in each odd-numbered group (1st.G, 3rd.G, . . . , 13th.G, and 15th.G) every exposure operation, is represented by the following equation:

$N=((i-1)*A/C+1)$

Thus, in the example shown in FIG. 9 (A=4*C), when the third exposure operation is performed (i=3), the last-read line-number "N" becomes "9", as explained with reference to FIG. 9.

In this embodiment, each DMD unit ($18_1$, . . . , $18_8$) has the number of 1024×1280 micro-mirror elements. Accordingly, when the last-read line-number "N" is "1024", the number of lateral bit-data lines, from each of which the 1280 bit-data is read at an exposure operation, reaches the maximum number "1024". In the example shown in FIG. 9 (A=4*C), when the number of exposure operation times "i" reaches "257", the last-read line-number "N" is "1025". In this case, the 1280 bit-data are read from each of the 1024 lateral bit-data lines, numbered by the line-numbers "N=2" to "N=1025". Namely, after the number of lateral bit-data lines reaches the maximum number "1024", i.e. when the last-read line-number "N" exceeds "1024", the line-number of the lateral bit-data line "N", from which the 1280 bit-data is read first in each odd-numbered group (1st.G, 3rd.G, . . . , 13th.G, and 15th.G), shifts in accordance with the movement of the drawing surface 32.

In this embodiment, in general, when an exposure operation is performed, it is possible to determine the line-number "N" of a lateral bit-data line, from which the 1280 bit-data is read first, based on the following discrimination equation:

$I=((i-1)*A/C+1)-1024$

Namely, if I≦0, the first-read line-number "N" is "1", and, if I>0, the first-read line-number "N" is determined by "(I+1)". In either case, the last-read line number "N" is determined by "((i−1)*A/C+1)".

Note, the aforesaid matter regarding the first array of DMD units $18_1$ to $18_8$ is true for the second array of DMD units $20_1$ to $20_7$ except that a starting of an initial exposure operation of the DMD units $20_1$ to $20_7$ is delayed by a time during which the drawing table 14, and therefore, the drawing surface 32, is moved by the distance "S" between the leading edges of the DMD units $18_1$ to $18_8$ and the leading edges of the DMD units $20_1$ to $20_8$ (FIG. 3).

Referring again to FIG. 11, reference 46 indicates the drive motor for moving the drawing table 14, and therefore the drawing surface 32, along the pair of guide rails 12, i.e. the X-axis of the coordinate system. As mentioned above, although the suitable drive mechanism is located between the drawing table 14 and the drive motor 46, it is symbolically represented by an arrow-headed broken line AL3.

In this embodiment, the drive motor 46 comprises a stepping motor. The stepping motor 46 is driven by a driver circuit 48, which is operated by an X-axis control circuit 50. To precisely and accurately control the movement of the drawing table 14, the X-axis control circuit 50 is connected to an X-position detecting sensor 52 securely attached to the drawing table 14, and the X-position detecting sensor 52 is associated with an X-linear-scale 54 securely provided on the base structure 10 and arranged along the X-axis of the coordinate system.

In particular, for example, the X-position detecting sensor 52 includes a light emitter having a light emitting diode (LED), and a light receiver having a photodiode. On the other hand, the X-linear-scale 54 has a plurality of divisions which represent a distance, along which the drawing table 14 is moved along the X-axis of the coordinate system, and each of the fine divisions of the X-linear-scale 54 is formed as a fine reflective area. During the movement of the drawing table 14, while the light emitter of the sensor 52 emits a light toward the division of the scale 54, the light receiver of the sensor 52 receives a light reflected from each division of the scale 54. Note, in FIG. 11, the reflected light is symbolically represented by an arrow-headed broken line AL4.

The X-position detecting sensor 52 produces a series of clock pulses based on the received lights, and the clock pulses are output to the X-axis control circuit 50, which operates the driver circuit 48 based on the clock pulses, whereby a series of drive clock pulses is output from the driver circuit 48 to the stepping motor 46. Thus, it is possible to control the movement of the drawing table 14 according to the precision of the divisions of the X-linear-scale 54.

As shown in FIG. 11, the X-axis control circuit 50 is connected to the system control circuit 34, and is thus operated under the control of the system control circuit 34. Also, the clock pulses, output from the X-position detecting sensor 52, are fed to the system control circuit 34 via the X-axis control circuit 50, and thus it is possible for the system control circuit to recognize and monitor the position of the drawing table 14 during the movement of the drawing table 14 along the X-axis of the coordinate system.

Figure 12:
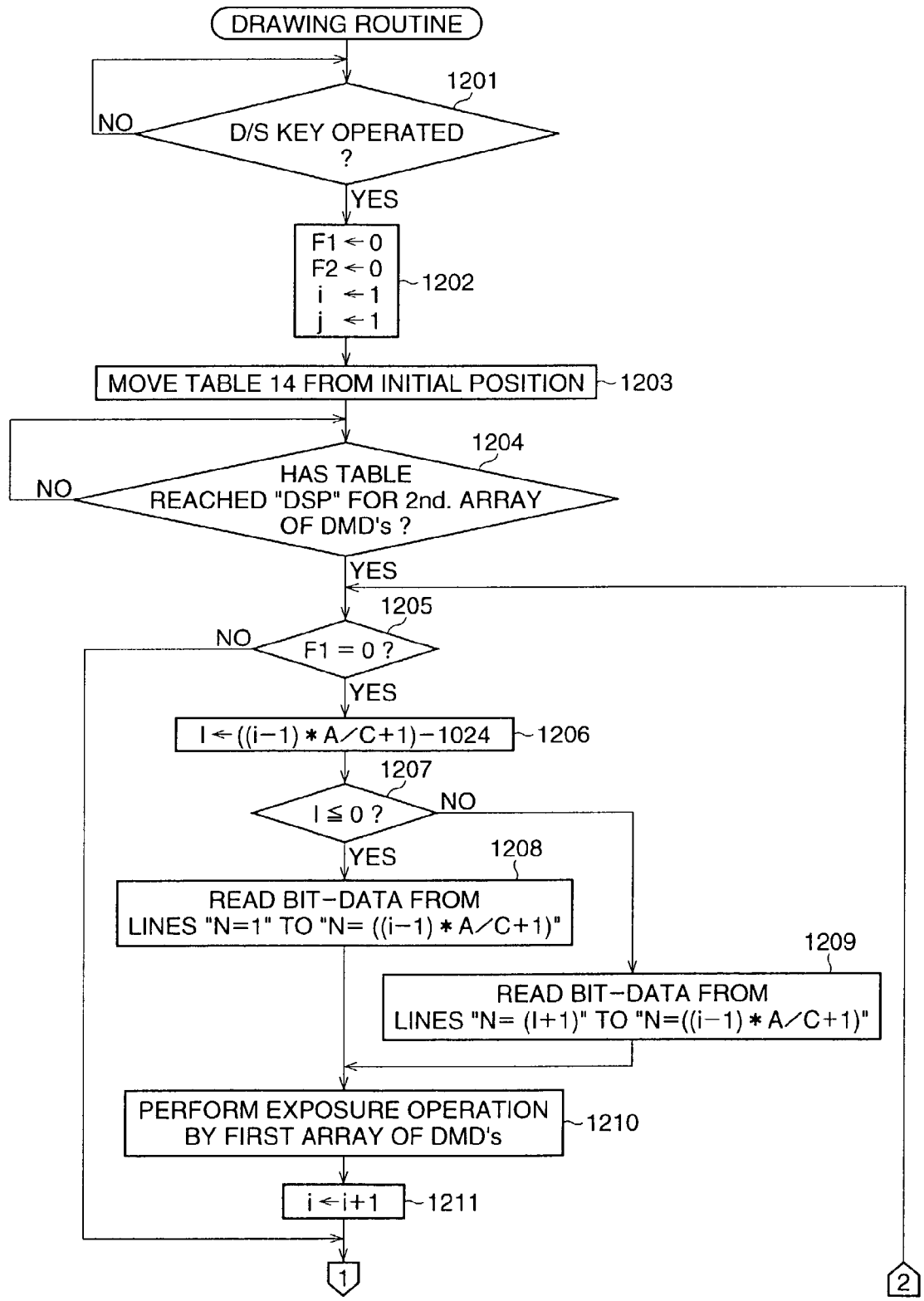
FIG. 12 is a part of a flowchart of a drawing routine executed in a system control circuit of the multi-exposure drawing apparatus.
Figure 13:
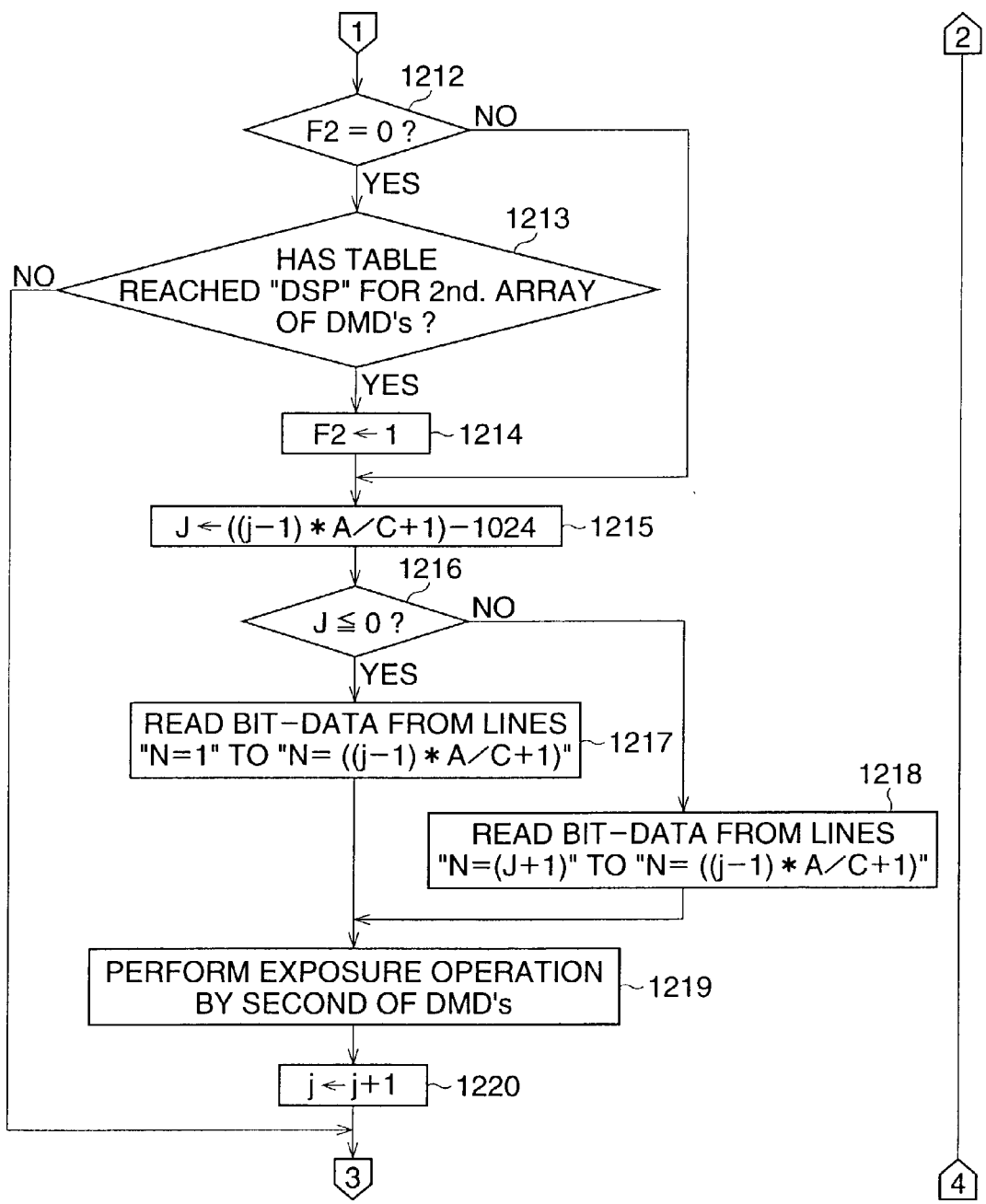
FIG. 13 is another part of the flowchart of the drawing routine.
Figure 14:
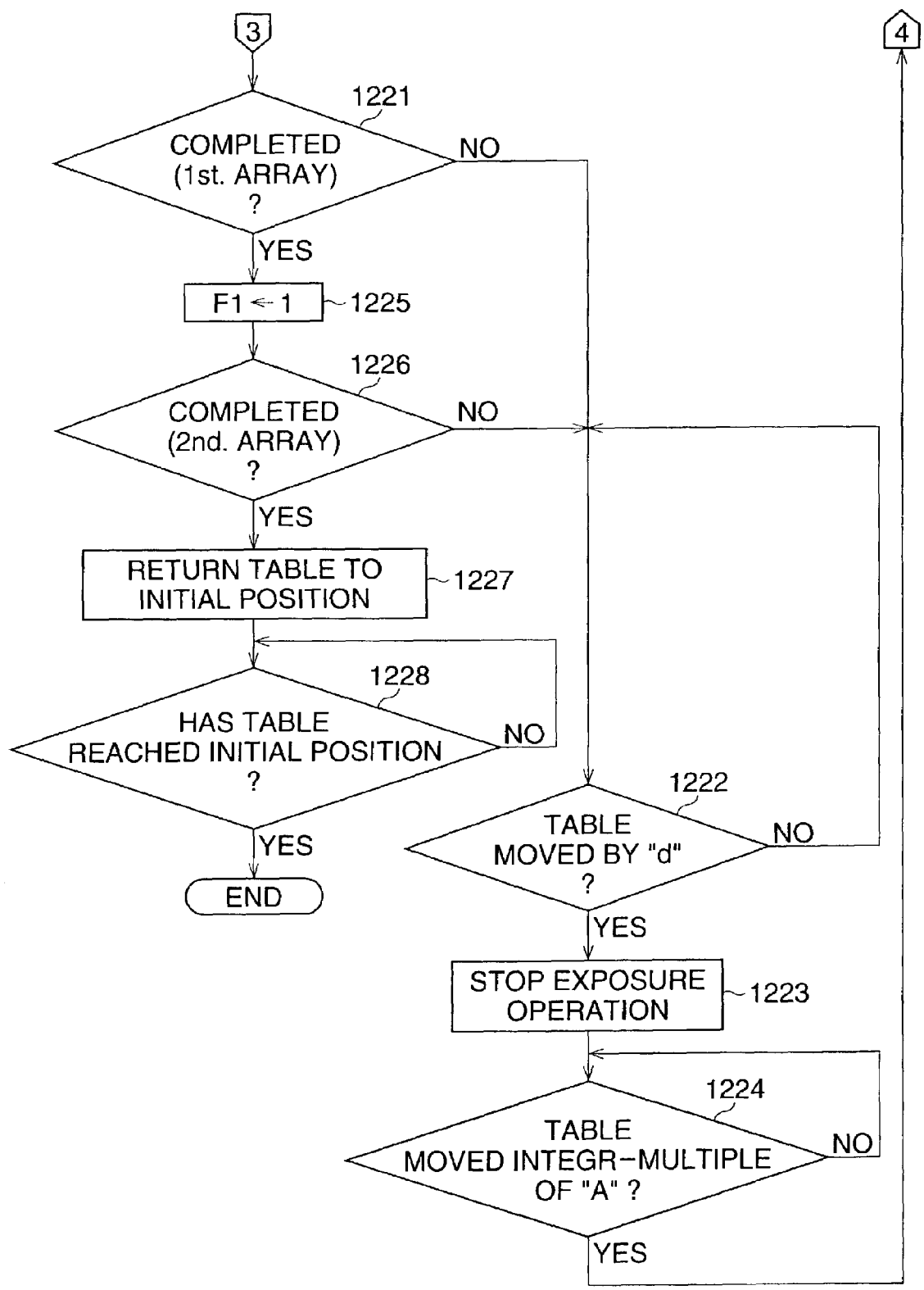
FIG. 14 is the remaining part of the flowchart of the drawing routine.

FIGS. 12, 13, and 14 show a flowchart of a drawing routine executed in the system control circuit 34. The execution of the drawing routine is started by turning ON a power ON/OFF switch (not shown) of the apparatus.

Note, it is supposed that raster-graphic circuit pattern data for drawing a circuit pattern are already developed and stored in the bit-map memory 42, as shown in FIG. 8, and that various data (e.g. distance data "d" and "A", velocity data for the drawing table 14, and so on) necessary to execute the drawing routine are already input to the RAM of the system control circuit 34 through the keyboard 38.

At step 1201, it is monitored whether a drawing-start key on the keyboard 38 has been operated. When the operation of the drawing-start key is confirmed, the control proceeds to step 1202, in which each of the flags F1 and F2 is initialized to "0", and each of the counters i and j is initialized to "1".

The flag F1 is provided for indicating whether all exposure operations for the first array of DMD units $18_1$ to $18_8$ are completed, and the flag F1 is changed from "0" to "1" when the completion of all the exposure operations is confirmed, as stated hereinafter.

The flag F2 is provided for indicating whether a workpiece on the drawing table 14 has reached a drawing-start position for the second array of DMD units $20_1$ to $20_7$, and the flag F2 is changed from "0" into "1" when the arrival of the workpiece at the drawing-start position for the second array of DMD units $20_1$ to $20_7$ is confirmed, as stated hereinafter.

The counter "i" counts a number of exposure operation times for the first array of DMD units $18_1$ to $18_8$, and the counter "j" counts a number of exposure operation times for the second array of DMD units $i20_1$ to $20_7$, as stated hereinafter.

At step 1203, the stepping motor 46 is driven to move the drawing table 14 from an initial or home position toward the bridge-like structure 16 in the minus direction of the X-axis of the coordinate system. In other words, both the first array of DMD units $18_1$ to $18_8$ and the second array of DMD units $i20_1$ to $20_7$ are moved in the plus direction of the X-axis of the coordinate system.

Note, of course, when the drawing table 14 is at the initial or home position, an initial position of the workpiece, placed on the drawing table 14, is previously specified with respect to the X-Y coordinate system, and is input as initial position data to the system control circuit 34 through the keyboard 38.

At step 1204, it is monitored whether the workpiece on the drawing table 14 has reached a drawing-start position for the first array of DMD units $18_1$ to $18_8$. When the arrival of the workpiece at the drawing start position for the first array of DMD units $18_1$ to $18_8$ is confirmed, the control proceeds to step 1205, in which it is determined whether the flag F1 is "0" or "1". At the initial stage, since F1=0, the control proceeds to step 1206, in which the following calculation is executed:

$$I \leftarrow ((i-1)*A/C+1)-1024$$

At step 1207, it is determined whether the result "I" is equal to or less than "0". At the initial stage in which the first exposure operation for the first array of DMD units $18_1$ to $18_8$ should be performed (i=1), the result "I" is minus (I<0). Thus, the control proceeds to step 1208, in which the 1280 bit-data are read from the first lateral bit-data lines "N=1" of each odd-numbered group (1st.G, 3rd.G, . . . , 13th.G, and 15th.G) in the bit-map memory 42 (FIG. 8), because, if i=1, N=((i−1)*A/C+1)=1.

Then, the control proceeds from step 1208 to step 1210, in which the first exposure operation is performed in accordance with the read bit-data (i=1). Namely, the 1280 micromirror elements, included in the first line of each DMD unit ($18_1$, . . . , $18_8$), are respectively operated in accordance with the 1280 bit-data included in the first lateral bit-data line "N=1" of each odd-numbered group (1st.G, 3rd.G, . . . , 13th.G, and 15th.G) in the bit-map memory 42 (FIG. 8). After the first exposure operation is started, the control proceeds to step 1211, in which the count value of the counter "i" is incremented by "1".

At step 1212 (FIG. 13), it is determined whether the flag F2 is "0" or "1". At the initial stage, since F2=0, the control proceeds to step 1213, in which it is monitored whether the workpiece on the drawing table 14 has reached a drawing-start position for the second array of DMD units $20_1$ to $20_7$. At the initial stage, since the workpiece on the drawing table 14 has not reached the drawing-start position for the second array of DMD units $20_1$ to $20_7$, the control proceeds from step 1213 to step 1221 (FIG. 14), in which it is monitored whether all the exposure operations for the first array of DMD units $18_1$ to $18_8$ have been completed. Of course, at the initial stage, all the exposure operations for the first array of DMD units $18_1$ to $18_8$ are still not completed, the control proceeds to step 1222.

At step 1222, it is monitored whether the workpiece has been moved by the distance "d" after the first exposure operation is started. Note, as already stated, the distance "d" is smaller than the dimension "C(20 μm)" of the pixel size "C×C". At step 1222, when the movement of the workpiece by the distance "d" is confirmed, the control proceeds to step 1223, in which the first exposure operation is stopped.

At step 1224, it is monitored whether the workpiece has been moved by an integer-multiple of the distance "A" from the drawing-start position for the first array of DMD units $18_1$ to $18_8$. Namely, at this initial stage, it is monitored whether the workpiece has been moved by one-multiple of the distance "A" from the drawing-start position for the first array of DMD units $18_1$ to $18_8$. When the movement of the workpiece by the distance "A" is confirmed, the control returns to step 1205 (FIG. 12).

Namely, an exposure operation for the first array of DMD units $18_1$ to $18_8$ is repeatedly performed whenever the workpiece has been moved by an integer-multiple of the distance "A" from the drawing-start position for the first array of DMD units $18_1$ to $18_8$ (step 1210), and the count value of the counter "i" is incremented by "1" whenever the exposure operation is repeated (step 1211).

As stated above, when A=4*C, the calculated result "I" (step 1206) is minus (I<0) until the count value of the counter "i" reaches "256". Accordingly, in each exposure operation, at step 1208, the 1280 bit-data are read from each of the lateral bit-data lines, numbered by "N=1" to "N=((i−1)*A/C+1)", of each odd-numbered group (1st.G, 3rd.G, . . . , 13th.G, and 15th.G) in the bit-map memory 42 (FIG. 8).

On the other hand, when the count value of the counter "i" exceeds "257", the calculated result "I" (step 1206) is changed from minus into plus (I>0). Thus, the control proceeds to step 1209, in which the 1280 bit-data are read from each of the lateral bit-data lines, numbered by "N=(I+1)" to "N=((i−1)*A/C+1)", of each odd-numbered group (1st.G, 3rd.G, . . . , 13th.G, and 15th.G) in the bit-map memory 42 (FIG. 8).

During the drawing operation by the first array of DMD units $18_1$ to $18_8$, at step 1213, when the arrival of the workpiece at the drawing-start position for the second array of DMD units $20_1$ to $20_7$ is confirmed, the control proceeds to step 1214, in which the flag F2 is made to be "1". Then, at step 1215, the following calculation is executed:

$$J \leftarrow ((j-1)*A/C+1) - 1024$$

At step 1216, it is determined whether the result "J" is equal to or less than "0". At the initial stage in which the first exposure operation for the second array of DMD units $20_1$ to $20_7$ should be performed (j=1), the result "J" is minus (J<0). Thus, the control proceeds to step 1217, in which the 1280 bit-data are read from the first lateral bit-data lines "N=1" of each even-numbered group (2nd.G, 4th.G, . . . , 12th.G, and 14th.G) in the bit-map memory 42 (FIG. 8), because, if j=1, N=((j−1)*A/C+1)=1.

Then, the control proceeds from step 1217 to step 1219, in which the first exposure operation is performed in accordance with the read bit-data (j=1). Namely, the 1280 micromirror elements, included in the first line of each DMD unit ($20_1$, . . . , $20_7$), are respectively operated in accordance with the 1280 bit-data included in the first lateral bit-data line "N=1" of each even-numbered group (2nd.G, 4th.G, . . . , 12th.G, and 14th.G) in the bit-map memory 42 (FIG. 8). After the first exposure operation is started, the control proceeds to step 1220, in which the count value of the counter "j" is incremented by "1".

At step 1221 (FIG. 14) it is monitored whether all the exposure operations for the first array of DMD units $18_1$ to $18_8$ have been completed. When the completion of all the exposure operations for the first array of DMD units $18_1$ to $18_8$ is not confirmed (i.e., at step 1210, an exposure operation for the first array of DMD units $18_1$ to $18_8$ has been started), the control proceeds to step 1222.

At step 1222, it is monitored whether the workpiece has been moved by the distance "d" after both the exposure operation for the first array of DMD units $18_1$ to $18_8$ and the exposure operation for the second array of DMD units $20_1$ to $20_7$ are started. At step 1222, when the movement of the workpiece by the distance "d" is confirmed, the control proceeds to step 1223, in which both the exposure operations for the first array of DMD units $18_1$ to $18_8$ and for the second array of DMD units $20_1$ to $20_7$ are stopped.

At step 1224, it is monitored whether the workpiece has been moved by an integer-multiple of the distance "A" from both the drawing-start positions for the first array of DMD units $18_1$ to $18_8$ and for the second array of DMD units $20_1$ to $20_7$. When the movement of the workpiece by the distance "A" is confirmed, the control returns to step 1205 (FIG. 13).

Namely, both exposure operations for the first array of DMD units $18_1$ to $18_8$ and for the second array of DMD units $20_1$ to $20_7$ are repeatedly performed whenever the workpiece has been moved by an integer-multiple of the distance "A" from both the drawing-start positions for the first array of DMD units $18_1$ to $18_8$ and for the second array of DMD units $20_1$ to $20_7$ (steps 1210 and 1219), and the count values of the counters "i" and "j" are incremented by "1" whenever both the exposure operations are repeated (steps 1211 and 1220).

Similar to the case of the calculated result "I" (step 1206), when A=4*C, the calculated result "J" (step 1215) is also minus (J<0) until the count value of the counter "j" reaches "256", because each DMD unit ($18_1$, . . . , $18_8$) included in the first array is identical to each DMD unit ($20_1$, . . . , $20_7$) included in the second array. Accordingly, in each exposure operation, at step 1217, the 1280 bit-data are read from each of the lateral bit-data lines, numbered by "N=1" to "N=((j−1)*A/C+1)", of each even-numbered group (2nd.G, 4th.G, . . . , 12th.G, and 14th.G) in the bit-map memory 42 (FIG. 8).

On the other hand, when the count value of the counter "j" exceeds "257", the calculated result "J" (step 1215) is changed from minus into plus (J>0). Thus, the control proceeds to step 1218, in which the 1280 bit-data are read from each of the lateral bit-data lines, numbered by "N=(J+1)" to "N=((j−1)*A/C+1)", of each even-numbered group (2nd.G, 4th.G, . . . , 12th.G, and 14th.G) in the bit-map memory 42 (FIG. 8).

Note, after the drawing operation is started by the second array of DMD units $20_1$ to $20_7$, the control skips steps 1213 and 1214, and goes to step 1215 because F2=1.

At step 1221 (FIG. 14), when the completion of all the exposure operations for the first array of DMD units $18_1$ to $18_8$ is confirmed, the control proceeds to step 1225, in which the flag F1 is made to be "1". Then, at step 1226, it is monitored whether all the exposure operations for the second array of DMD units $20_1$ to $20_7$ have been completed.

At step 1226, when the completion of all the exposure operations for the second array of DMD units $20_1$ to $20_7$ is not confirmed, the control proceeds to step 1222. Thus, from now on, only the exposure operation for the second array of DMD units $20_1$ to $20_7$ is repeatedly performed in substantially the same manner as stated above.

Note, after all the exposure operations for the first array of DMD units $18_1$ to $18_8$ are completed, the control skips steps 1206 to 1211, and goes to step 1212 (FIG. 13) because F1=1.

At step 1226, when the completion of all the exposure operations for the second array of DMD units $20_1$ to $20_7$ is confirmed, the control proceeds to step 1227, in which the stepping motor 46 is reversely driven, thereby moving the drawing table 14 toward the initial or home position. Then, at step 1228, it is monitored whether the drawing table 14 has returned to the initial or home position. When the return of the drawing table 14 to the initial or home position is confirmed, the routine ends.

As is apparent from the above, according to the present invention, since the drawing table is continuously moved during the drawing operation, it is possible to efficiently draw a circuit pattern on the workpiece at a high speed. Further even when a low power light source device is used, a circuit pattern can be drawn at a relatively high speed, due to the continuous movement of the drawing table.

Also, according to the present invention, since it is unnecessary to frequently repeat acceleration and deceleration of the drawing table, the drive mechanism for driving the drawing table is not susceptible to damage.

Further, according to the present invention, although any one of the optical modulation elements of the exposure unit may malfunction, it is possible to properly carry out the drawing operation without exchanging the exposure unit for a new one, because an exposure zone or pixel dot is produced on the drawing surface in the multi-exposure manner, using a plurality of different modulation elements or micro-mirror elements. Also, although light beams reflected from the different modulation elements or micro-mirror elements have somewhat uneven intensities, it is possible to draw a circuit pattern on the drawing surface at a uniform exposure level, for the same reasons as mentioned above.

Finally, it will be understood by those skilled in the art that the foregoing description is of a preferred embodiment of the system, and that various changes and modifications may be made to the present invention without departing from the spirit and scope thereof.

The disclosure relates to subject matters contained in Japanese Patent Application No. 2001-198375 (filed on Jun. 29, 2001) which is expressly incorporated herein, by reference, in its entirety.

The invention claimed is:

1. A multi-exposure drawing method for drawing a pattern on a drawing surface, using an exposure unit including a plurality of optical modulation elements arranged in a matrix, the drawing method comprising:
providing continuous constant relative movement between the exposure unit and the drawing surface in a predetermined direction defined by the matrix; and
successively and selectively driving the optical modulation elements so as to repeat an exposure by successively modulating aligned optical modulation elements on the basis of a same bit datum whenever the exposure unit is moved by a distance corresponding to a uniform interval, whereby a pixel dot is produced on the drawing surface in a multi-exposure manner by successively-modulated light beams, the pixel dot comprising an area having at least a predetermined exposure level,
wherein an exposure time for producing the pixel dot by each of the successively-modulated light beams is shorter than a time that is required to move the exposure unit by a distance corresponding to a size of an exposure zone.

2. The multi-exposure drawing method as set forth in claim 1, wherein a distance corresponding to the uniform interval is equivalent to an integral multiple of the size of the exposure zone.

3. The multi-exposure drawing method as set forth in claim 2, wherein a number of exposures for producing the pixel dot on the drawing surface by the successively-modulated light beams is equivalent to a quotient obtained by dividing a length of the alignment of optical modulation elements by the distance corresponding to the uniform interval.

4. The multi-exposure drawing method as set forth in claim 1, wherein the predetermined exposure level comprises a predetermined percentage of a maximum exposure level.

5. The multi-exposure drawing method as set forth in claim 1, wherein the optical modulation elements comprise digital micro-mirror device units.

6. The multi-exposure drawing method as set forth in claim 1, wherein said exposure unit is configured as a plurality of arrays of spaced exposure units, a spacing of the exposure units of each array being staggered with respect to a spacing of exposure units of the other array, the exposure units of each array extending along a direction perpendicular to the predetermined direction.

7. The multi-exposure drawing method as set forth in claim 1, further comprising fixedly positioning the exposure unit, including the plurality of optical modulation elements, and moving the drawing surface.

8. A multi-exposure drawing apparatus that draws a pattern on a drawing surface, using an exposure unit including a plurality of optical modulation elements arranged in a matrix, the apparatus comprising:
a movement system configured to provide continuous constant relative movement between the exposure unit and the drawing surface in a predetermined direction defined by the matrix;
a modulation system configured to successively and selectively drive the optical modulation elements so as to repeat an exposure by successively modulating optical modulation elements on the basis of a same bit datum whenever the exposure unit is moved by a distance corresponding to a uniform interval, whereby a pixel dot is produced on the drawing surface in a multi-exposure manner by successively modulated light beams, the pixel dot comprising an area having a least a predetermined exposure level; and
a controller configured to control the movement system and the modulation system such that an exposure time for producing the dot pixel by each of the successively-modulated beams is shorter than a time required to move the exposure unit by a distance corresponding to a size of an exposure zone.

9. The multi-exposure drawing apparatus as set forth in claim 8, wherein the modulation system includes an optical focusing system that forms the pixel dot on the drawing surface with the modulated light beam in a same size as a size of the corresponding optical modulation element, whereby the distance corresponding to the uniform interval is equivalent to an integral multiple of the size of the exposure zone.

10. The multi-exposure drawing apparatus as set forth in claim 8, wherein the number of exposures for producing the pixel dot on the drawing surface by the successively-modulated light beams is equivalent to a quotient obtained by dividing a length of the alignment of the optical modulation elements by the distance corresponding to the uniform interval, as a result of the optical focusing system.

11. The multi-exposure drawing apparatus as set forth in claim 8, wherein the predetermined exposure level is a predetermined percentage of a maximum exposure level.

12. The multi-exposure drawing apparatus as set forth in claim 8, said optical modulation units comprising digital micro-mirror device units.

13. The multi-exposure drawing apparatus as set forth in claim 8, wherein the exposure unit comprises a plurality of arrays of spaced exposure units, a spacing of the exposure units of each array being staggered with respect to a spacing of the exposure units of the other array, the exposure units of each array extending along a direction transverse to the predetermined direction.

14. The multi-exposure drawing apparatus as set forth in claim 8, wherein the exposure unit, including the plurality of optical modulation elements, are fixedly positioned and the drawing surface is moved.

* * * * *